(12) United States Patent
Ferran Palau et al.

(10) Patent No.: US 10,111,353 B2
(45) Date of Patent: Oct. 23, 2018

(54) ELECTRICAL UNIT (71) Applicant: Lear Corporation, Southfield, MI (US)

(72) Inventors: Joan Ignasi Ferran Palau, Valls (ES); Ramón Piñana López, Valls (ES); Xavier Carbonell, Valls (ES); Jose Gabriel Fernández Bañares, Valls (ES); Enric Aparicio Rollan, Valls (ES); Marcos Blanco Figueras, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 15/433,461

(22) Filed: Feb. 15, 2017

(65) Prior Publication Data

US 2017/0251565 A1 Aug. 31, 2017

Related U.S. Application Data (60) Provisional application No. 62/300,450, filed on Feb. 26, 2016.

(51) Int. Cl.
*H05K 5/00* (2006.01)
*H05K 7/14* (2006.01)
*H02G 3/08* (2006.01)

(52) U.S. Cl.
CPC ............ *H05K 7/1417* (2013.01); *H02G 3/08* (2013.01); *H05K 5/006* (2013.01); *H05K 7/142* (2013.01); *H05K 7/1427* (2013.01)

(58) Field of Classification Search
CPC ..... H05K 5/0052; H05K 7/1417; H05K 5/006
See application file for complete search history.

(56) References Cited

U.S. PATENT DOCUMENTS

| 3,688,635 | A | * | 9/1972 | Fegen | F16B 21/082 174/138 A |
|---|---|---|---|---|---|
| 4,143,577 | A | * | 3/1979 | Eberhardt | F16B 21/088 411/548 |
| 4,297,769 | A | * | 11/1981 | Coules | F16B 21/086 174/138 D |
| 4,875,140 | A | * | 10/1989 | Delpech | H05K 7/142 361/789 |
| 5,363,276 | A | * | 11/1994 | Crockett | H05K 7/142 174/535 |
| 6,362,978 | B1 | * | 3/2002 | Boe | G06F 1/184 248/65 |
| 7,733,667 | B2 | * | 6/2010 | Qin | H05K 7/142 174/138 E |
| 8,039,764 | B2 | * | 10/2011 | Yang | H05K 7/142 174/138 G |
| 2012/0250279 | A1 | * | 10/2012 | Harashima | G06F 1/187 361/760 |
| 2013/0343015 | A1 | * | 12/2013 | Malek | H05K 7/1417 361/752 |

(Continued)

*Primary Examiner* — Hug V Ngo
(74) *Attorney, Agent, or Firm* — Fishman Stewart PLLC (57) ABSTRACT

An unit housing includes a first housing member, a second housing member, a circuit board disposed at least partially between the first housing member and the second housing member, a positioning column disposed at least partially in the circuit board, a first resilient member connected to the positioning column between the circuit board and the first housing member, and a second resilient member connected to the positioning column between the circuit board and the second housing member.

19 Claims, 10 Drawing Sheets

(56) References Cited

U.S. PATENT DOCUMENTS

2014/0126145 A1\* 5/2014 Shih .................... H05K 5/0213
361/692
2015/0146400 A1\* 5/2015 Huffman ................ H05K 1/144
361/790

\* cited by examiner

ELECTRICAL UNIT

CROSS-REFERENCE TO RELATED APPLICATION

This application claims the benefit of U.S. Provisional Application Ser. No. 62/300,450, filed Feb. 26, 2016, the disclosure of which is hereby incorporated herein by reference in its entirety.

TECHNICAL FIELD

The present disclosure relates to circuit boards, headers, electrical units, power distribution units, electrical junction boxes, electrical housings, electronic control units, gateway units, and body domain controllers, including those that may be used in vehicles.

BACKGROUND

This background description is set forth below for the purpose of providing context only. Therefore, any aspects of this background description, to the extent that it does not otherwise qualify as prior art, is neither expressly nor impliedly admitted as prior art against the instant disclosure.

In some circumstances, assembling circuit board components with a circuit board (e.g., a printed circuit board or PCB), may involve subjecting the circuit board to forces that may result in the circuit board including at least some curvature or bending. If the circuit board is assembled in a housing, the housing may fix the circuit board in place (e.g., so the circuit board does not rattle). In some instances, fixation forces may act against a curvature of the circuit board, which may lead to damage to the circuit board and/or components connected to the circuit board, such as surface mount devices (SMDs). In some cases, housings may apply increased forces to a circuit board (e.g., due to housing manufacturing tolerances) that could damage a circuit board and/or components connected thereto.

There is therefore a desire for solutions/options that minimize or eliminate one or more of the above-described shortcomings. The foregoing discussion is intended only to illustrate examples of the present field and should not be taken as a disavowal of scope.

SUMMARY

In embodiments, an electrical unit may comprise a first housing member, a second housing member, a circuit board that may be disposed at least partially between the first housing member and the second housing member, a positioning column that may be disposed at least partially in and/or through the circuit board, and/or a first resilient member that may be connected to the positioning column between the circuit board and the first housing member. An electrical unit of may comprise a second resilient member that may be connected to the positioning column between the circuit board and the second housing member. The positioning column may be disposed at least partially in the first housing member and the second resilient member may be in contact with the second housing member. The positioning column is integrated with the second housing member. The positioning column may include a first portion, a second portion that may include a radial flange, and a third portion. The third portion may include a flared portion configured for insertion through the circuit board. At least a portion of the circuit board may be disposed between the flared portion and the radial flange. The first resilient member may include a first height, the second resilient member may include a second height, and the first height may be greater than the second height. The positioning column may include a first flared portion and/or a second flared portion. At least a portion of the circuit board may be disposed between the first flared portion and the second flared portion. The first flared portion and the second flared portion may be configured to be inserted through the circuit board. The first flared portion may include a first tab and a second tab. The second flared portion may include a third tab and/or a fourth tab. The positioning column may be metal and/or hollow. The first housing member may include a projection disposed in the positioning column. The radial flange may include a plurality of ribs configured to engage the circuit board. The first portion of the positioning column may include a narrow portion and a head disposed at an end of the narrow portion. The head may include a greater diameter than the narrow portion. The first housing member may be configured to receive and retain the head. The positioning column may be interference fit with the circuit board.

With embodiments, a circuit board assembly may comprise a circuit board and a positioning column. The positioning column may include a first portion that may be disposed above a first side of the circuit board, a middle portion that may be disposed in the circuit board, and/or a bottom portion that may be disposed below a second side of the circuit board. The circuit board assembly may include at least one of (i) a first resilient member connected to the top portion of the positioning column and (ii) a second resilient member connected to the bottom portion of the positioning column.

In embodiments, an electrical unit may comprise a first housing member, a second housing member, a circuit board that may be disposed at least partially between the first housing member and the second housing member, a resilient positioning column. The resilient positioning column may include a tapered first portion that may be disposed above a first side of the circuit board, a second portion that may be disposed at least partially in the circuit board, and/or a substantially spherical third portion disposed below a second side of the circuit board. The middle portion may include a recess that may be configured to receive a least a portion of the circuit board. The first housing member may include a tapered recess configured to receive the tapered first portion of the positioning column. The second housing member may include a spherical cap-shaped recess that may be configured to receive at least a portion of the substantially spherical third portion.

The foregoing and other aspects, features, details, utilities, and advantages of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure.

Figure 1:
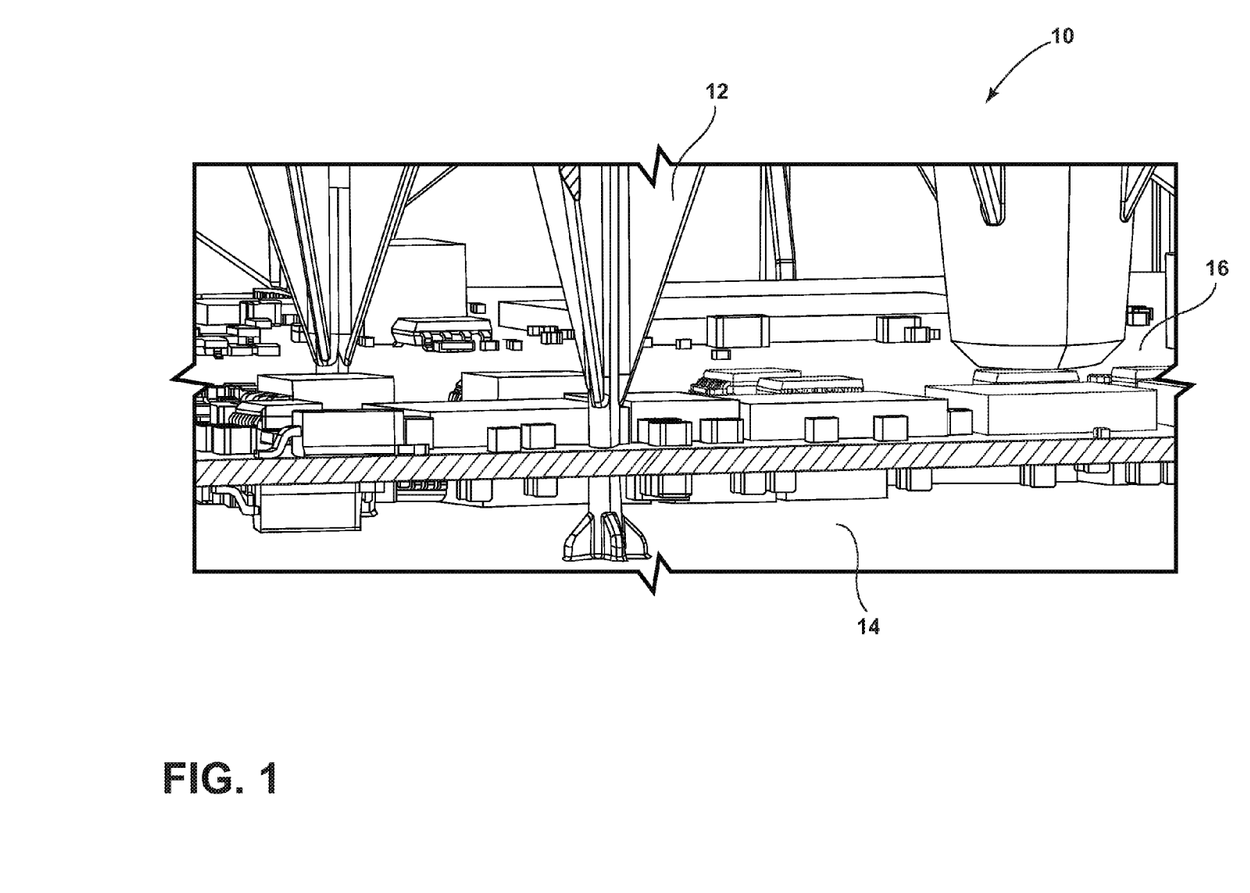
FIG. 1 is a perspective view of an interior of a housing and a circuit board.

As generally illustrated in FIG. 1, a housing 10 may include a first housing member 12, a second housing member 14, and a circuit board 16. During assembly of circuit board 16 with first housing member 12 and second housing member 14, first housing member 12 and/or second housing member 14 may apply undesired forces to circuit board 16, which may damage circuit board 16 and/or components attached thereto.

Figure 2:
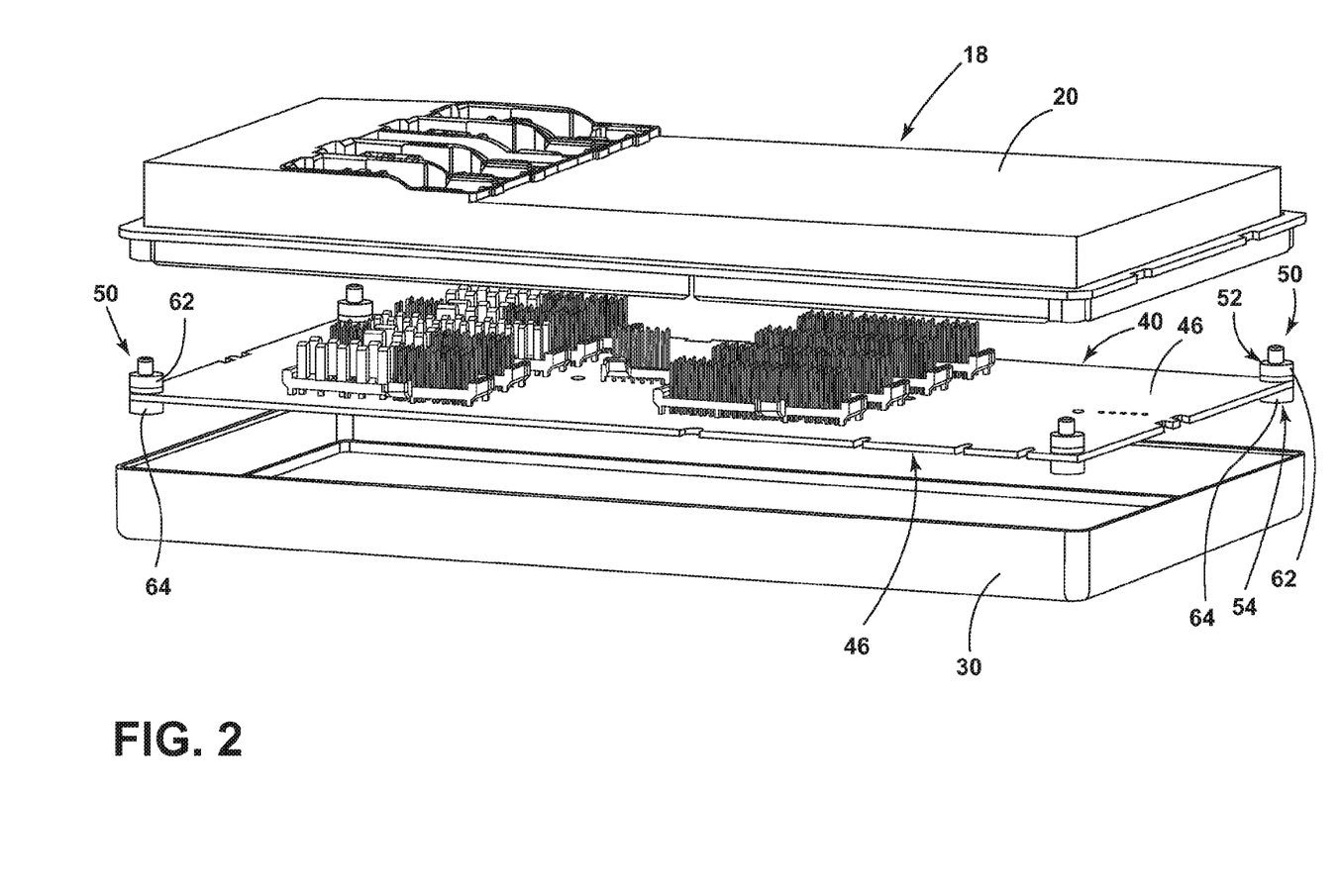
FIG. 2 is an exploded perspective view of an embodiment of an electrical unit with a first housing member, a second housing member, a circuit board, and a plurality of positioning columns in accordance with teachings of the present disclosure.

In embodiments, such as generally illustrated in FIG. 2, an electrical unit 18 may include a first housing member 20, a second housing member 30, a circuit board 40, and one or more positioning columns 50. Electrical unit 18 may include, for example, an electrical housing, an electrical junction box, and/or a power distribution box.

Figure 3:
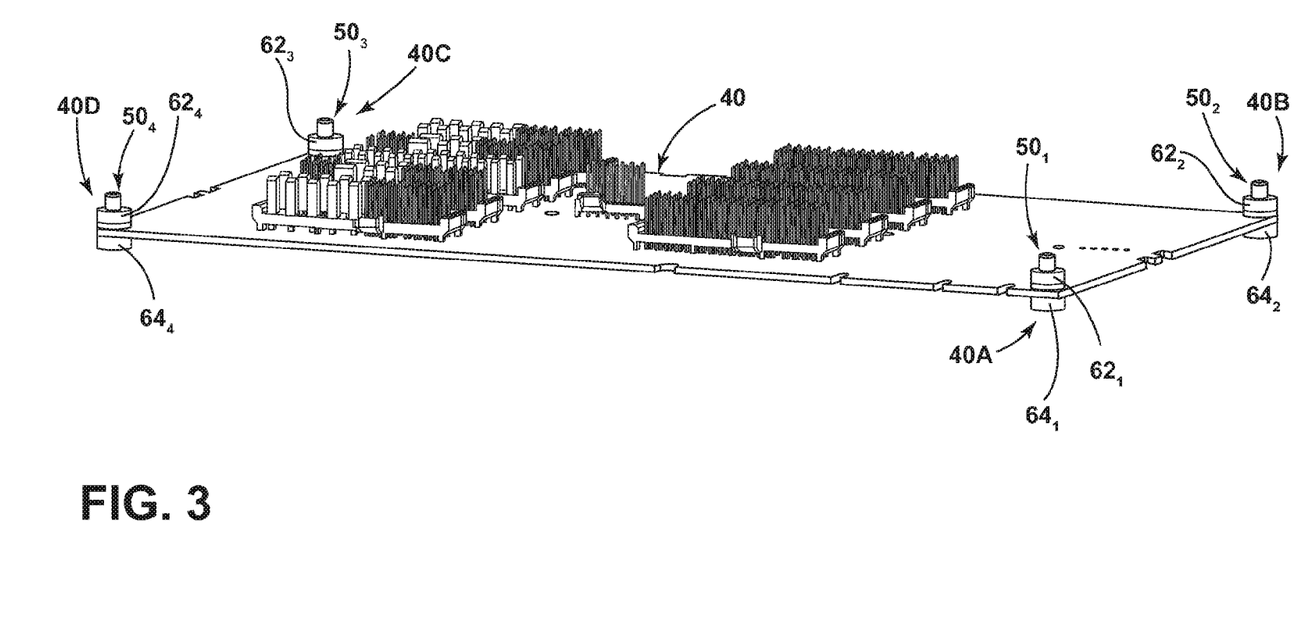
FIG. 3 is a perspective view of an embodiment of a circuit board and a plurality of positioning columns in accordance with teachings of the present disclosure.

As generally illustrated in FIGS. 2 and 3, in embodiments, a plurality of positioning columns 50 may be connected to circuit board 40. For example, and without limitation, a positioning column (e.g., columns $50_1$, $50_2$, $50_3$, $50_4$) may be disposed at or about each corner of circuit board 40 (see, e.g., FIG. 3). Positioning columns 50 may be configured to facilitate connecting and/or fixing of circuit board 40 relative to first housing member 20 and/or second housing member 30.

In embodiments, positioning columns 50 may be used in connection with one or more resilient members 62, 64. Resilient members may include one or more of a variety of shapes, sizes, configurations, and/or materials. For example, and without limitation, resilient members may include a resilient material, such as rubber, and/or may include a generally ring-shaped configuration (e.g., rubber rings). With embodiments, a first resilient member 62 may be connected to and/or disposed at least partially around a top portion 52 of a positioning column 50 and may be configured to engage and/or come into contact with first housing member 20. First resilient member 62 may be configured to absorb and/or compensate for forces from first housing member 20 and/or second housing member 30, such as forces that might otherwise be applied to circuit board 40. A second resilient member 64 may be connected to and/or disposed at least partially around a bottom portion 54 of a positioning column 50 and may be configured to engage and/or come into contact with second housing member 30. Second resilient member 64 may be configured to absorb and/or compensate for forces from second housing member 30, such as forces that might otherwise be applied to circuit board 40.

With embodiments, the strength of first resilient member 62 and/or second resilient member 64 may be determined according to an average shape (e.g., across manufacturing cycles) of circuit board 40, first housing member 20, and/or second housing member 30. The strengths of first resilient member 62 and second resilient member 64 may or may not be the same. In embodiments, heights 62A, 64A of first resilient member 62 and second resilient member 64 may or may not be the same. For example, and without limitation, the height 62A of first resilient member 62 may be greater than the height 64A of second resilient member 64. With embodiments, the strengths of each set of first and second resilient members 62, 64 may vary by location of the resilient members 62, 64 relative to circuit board 40 (e.g., according to average circuit board and housing member shapes) and may or may not be the same. For example, and without limitation, a first resilient member $62_1$ may be disposed at or about a first corner 40A of circuit board 40 and may be stronger than a first resilient member $62_2$ that may be disposed at or about a second corner 40B of circuit board 40, and/or first resilient member $62_1$ may be about as strong as a first resilient member $62_3$ that may be disposed at or about a third corner 40C of circuit board 40 (see, e.g., FIG. 3). A first resilient member $62_4$ may be disposed at a fourth corner 40D of circuit board 40. Second resilient members 64 (e.g., second resilient members $64_1$, $64_2$, $64_4$, and another second resilient member not visible in FIG. 3) may be associated/connected with positioning columns $50_1$, $50_2$, $50_3$, $50_4$, respectively. With embodiments, positioning columns 50 and first resilient members 62 and/or second resilient member 64, which may be associated with positioning columns 50, may be disposed at various positions relative to circuit board 40, which may include being disposed at or about corners of circuit board 40 and/or being disposed at other positions relative to circuit board 40. For example, and without limitation, a circuit board assembly may include at least three positioning columns 50 with first and second resilient members 62, 64 associated therewith, which may or may not be disposed at or about corners of circuit board 40.

Figure 4:
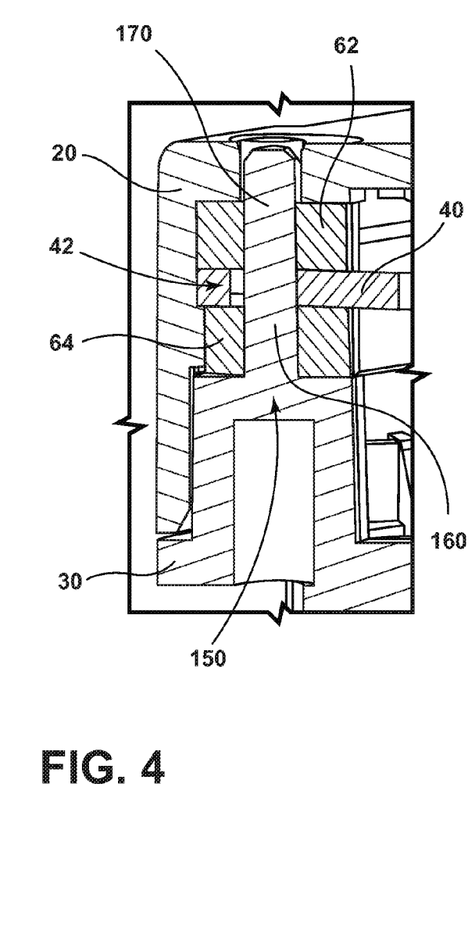
FIG. 4 is a cross-sectional view of an embodiment of an electrical unit with a first housing member, a second housing member, a circuit board, a positioning column, a first resilient member, and a second resilient member according to teachings of the present disclosure.
Figure 5:
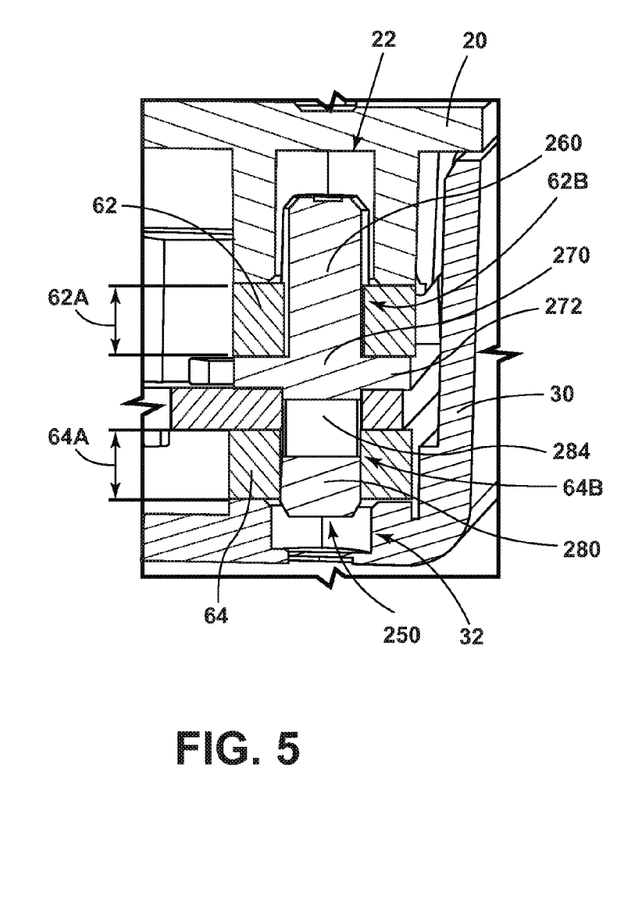
FIG. 5 is a cross-sectional view of an embodiment of an electrical unit with a first housing member, a second housing member, a circuit board, a positioning column, a first resilient member, and a second resilient member according to teachings of the present disclosure.
Figure 6A:
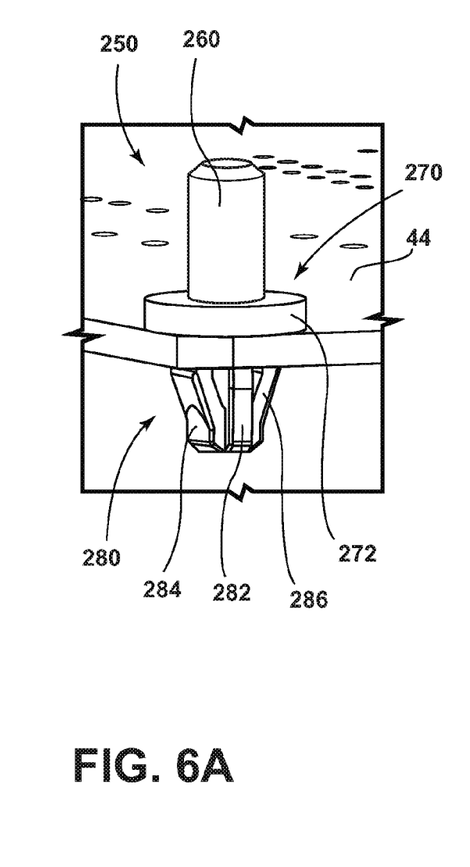
FIG. 6A is a perspective view of an embodiment of a circuit board and a positioning column according to teachings of the present disclosure.
Figure 6B:
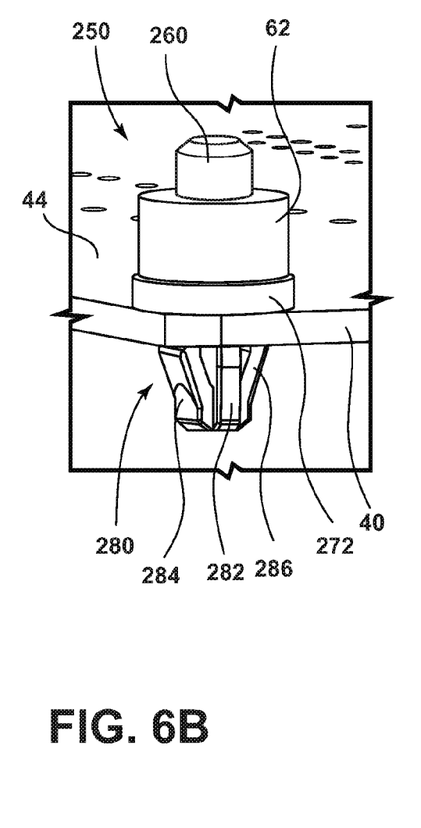
FIG. 6B is a perspective view of an embodiment of a circuit board, a positioning column, and a first resilient member according to teachings of the present disclosure.
Figure 6C:
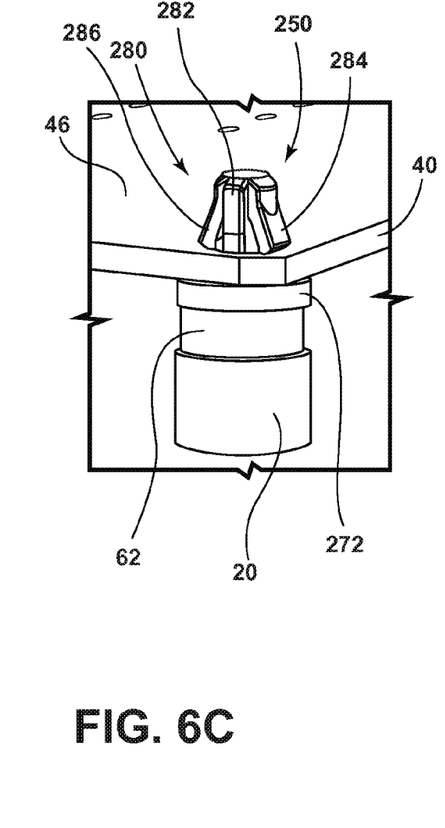
FIG. 6C is a perspective view of an embodiment of a circuit board, a positioning column, a first resilient member, and a first housing member according to teachings of the present disclosure.
Figure 6D:
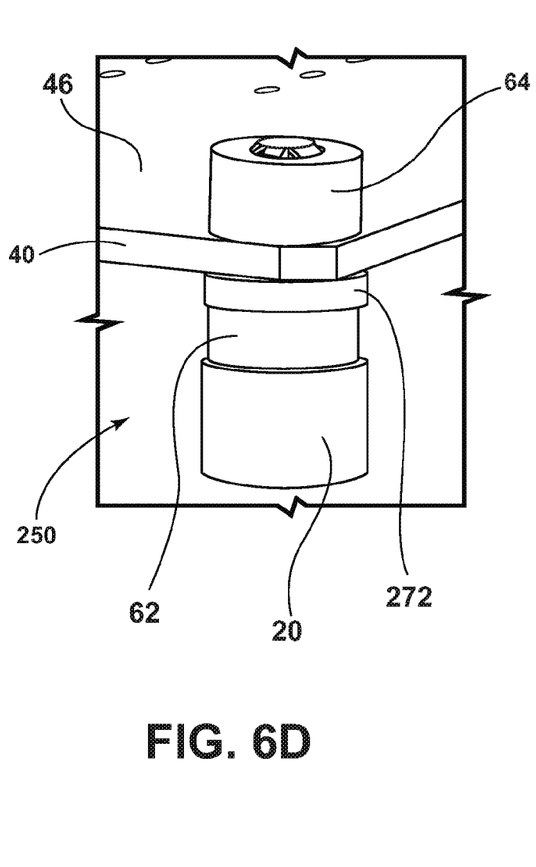
FIG. 6D is a perspective view of an embodiment of a circuit board, a positioning column, a first resilient member, a first housing member, and a second resilient member according to teachings of the present disclosure.
Figure 6E:
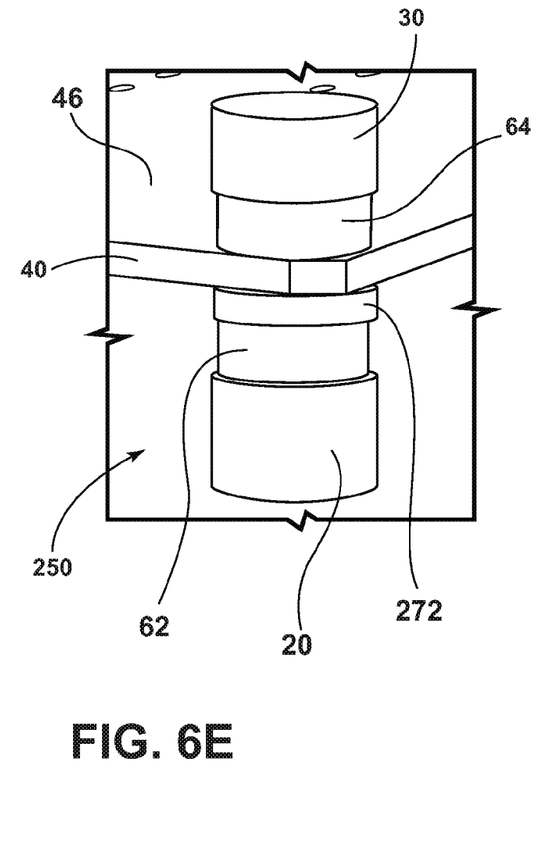
FIGS. 6E and 6F are perspective views of an embodiment of a circuit board, a positioning column, a first resilient member, a first housing member, a second resilient member, and a second housing member according to teachings of the present disclosure.
Figure 6F:
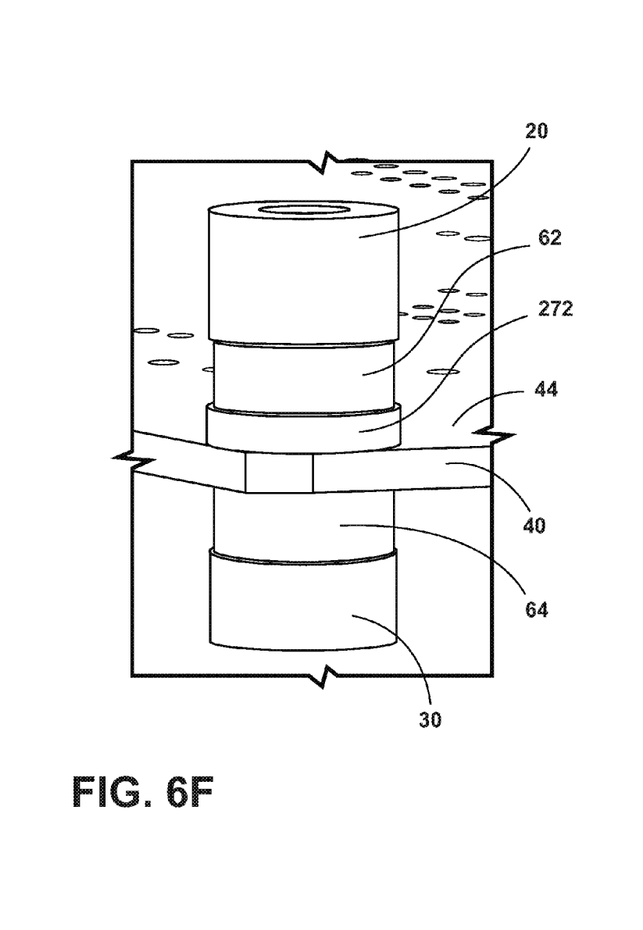
Figure 6G:
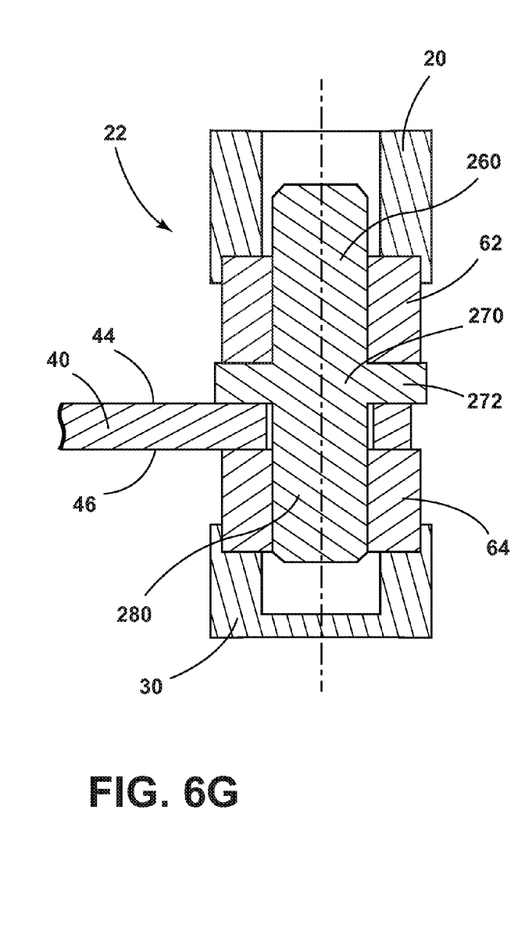
FIG. 6G is a cross-sectional view of an embodiment of a circuit board, a positioning column, a first resilient member, a first housing member, a second resilient member, and a second housing member according to teachings of the present disclosure.

In embodiments, such as generally illustrated in FIGS. 4 and 5, a positioning column (e.g., columns 150, 250) may be a separate component or may be integrated with a housing member 20, 30. For example, and without limitation, a positioning column 150 may be formed and/or integral with second housing member 30, and may include the same material as a housing member 20, 30 (e.g. a plastic) and/or may include a different material (e.g., metal) and housing member 20, 30 may be formed around positioning column 150. With embodiments, positioning column 150 may extend vertically upward from a second housing member 30 through circuit board 40 and into first housing member 20 (see, e.g., FIG. 4). A first resilient member 62 may be connected to and/or disposed at least partially around a top portion 160 of positioning column 150, and may be disposed at least partially between first housing member 20 and circuit board 40. A second resilient member 64 may be connected to and/or disposed at least partially around a bottom portion 170 of positioning column 150, and may be disposed at least partially between second housing member 30 and circuit board 40. Positioning column 150 may, in embodiments, include a generally cylindrical configuration and may include the same material as second housing member 30 (e.g., plastic).

With embodiments, such as generally illustrated in FIGS. 5, 6A, 6B, 6C, 6D, 6E, 6F, and 6G, a positioning column 250 may include a first portion 260, a second portion 270, and/or a third portion 280. First portion 260 may correspond to a top portion of positioning column 250, second portion 270 may correspond to a middle portion of positioning column 250 that may be disposed between first portion 260 and third portion 280, and/or third portion 280 may correspond to a bottom portion of positioning column 250. First portion 260 may include a generally cylindrical configuration. First resilient member 62 may be configured to receive at least some of first portion 260 (e.g., may include a cylindrical aperture 62B for receiving first portion 260). Second portion 270 may include a flange 272 that may extend radially outward. Flange 272 may be configured to be disposed adjacent to circuit board 40 and/or to limit an insertion depth of positioning column 250 through circuit board 40. At least some of second portion 270 may be disposed in circuit board 40 (e.g., in and/or through an aperture 42). Third portion 280 may include, for example, a generally planar and rectangular body 282. A first tab 284 may extend from a first side of body 282 and/or a second tab 286 may extend from a second side of body 282. First tab 284 and/or second tab 286 may be configured to deflect. For example, and without limitation, third portion 280 of positioning column 250 may be inserted into circuit board 40 and first tab 284 and/or second tab 286 may deflect inward during insertion. Once positioning column 250 is inserted through circuit board 40 such that tabs 284, 286 are disposed at/beyond a bottom 46 of circuit board (e.g., tabs 284, 286 are not disposed in aperture 42), first tab 284 and/or second tab 286 may deflect back outward, which may restrict movement of positioning column 250 back out of circuit board 40. Tabs 284, 286 may extend generally toward first portion 260 and/or may be circumferentially aligned with each other. Second resilient member 64 may be configured to receive at least some of third portion 280. For example, and without limitation, second resilient member 64 may include an aperture 64B that may include a generally cylindrical configuration or a rectangular configuration that may include angled portions that may be aligned with first and second tabs 282, 284. Third portion 280 may be referred to as a flared portion and/or as a tabbed portion.

As generally illustrated in FIGS. 6C-6G, in embodiments, first housing member 20 may be configured to receive at least a portion of first resilient member 62 and/or first portion 260 of positioning column 250. For example, and without limitation, in an assembled configuration (see, e.g., FIGS. 5, 6E-6G), at least some of first resilient member 62 and positioning column first portion 260 may be disposed in a mating portion 22 of first housing member 20. Second housing member 30 may be configured to receive at least some of second resilient member 64 and/or third portion 280 of positioning column 250. For example, and without limitation, in an assembled configuration, at least some of second resilient member 64 and positioning column third portion 280 may be disposed in a mating portion 32 of second housing member 30.

Figure 7A:
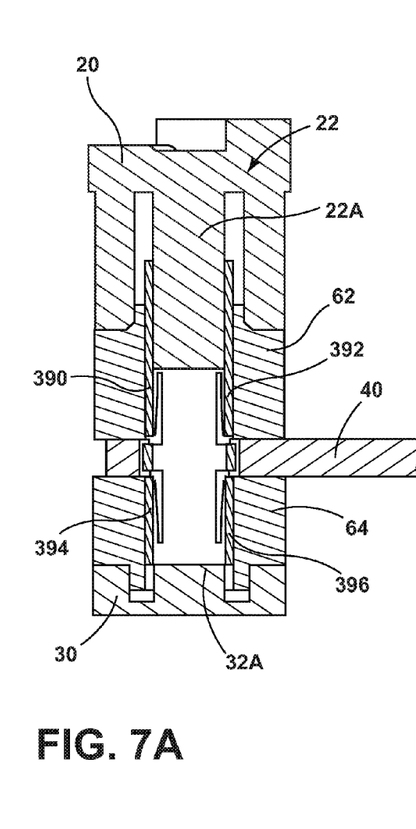
FIG. 7A is a cross-sectional view of an embodiment of a circuit board, a positioning column, a first resilient member, a first housing member, a second resilient member, and a second housing member according to teachings of the present disclosure.
Figure 7B:
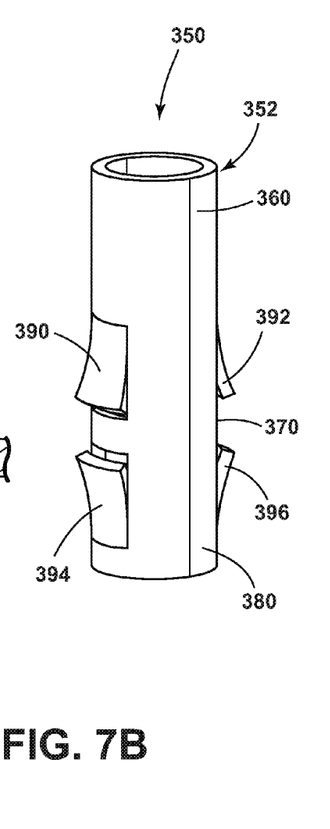
FIG. 7B is a perspective view of an embodiment of a positioning column according to teachings of the present disclosure.
Figure 7C:
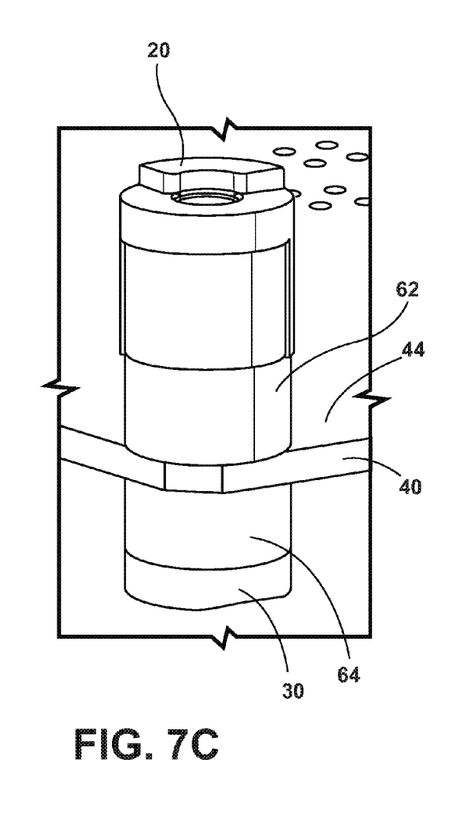
FIG. 7C is a perspective view of an embodiment of a circuit board, a positioning column covered by a first resilient member, a first housing member, a second resilient member, and a second housing member according to teachings of the present disclosure.

In embodiments, such as generally illustrated in FIGS. 7A, 7B, and 7C, a positioning column 350 may include a generally cylindrical configuration and/or may be hollow. Positioning column 350 may include a first portion 360, a second portion 370, and/or a third portion 380. First portion 360 may correspond to a top portion of positioning column 350, second portion 370 may correspond to a middle portion of positioning column 350 that may be disposed between first portion 360 and third portion 380, and/or third portion 380 may correspond to a bottom portion of positioning column 350. Positioning column 350 may, for example, include metal. With embodiments, positioning column 350 may include one or more tabs. For example, and without limitation, positioning column may include a first tab 390, a second tab 392, a third tab 394, and/or a fourth tab 396. First tab 390 and/or second tab 392 may extend from first portion 360 and/or may be configured to engage a first side 44 of circuit board 40. Third tab 394 and/or fourth tab 396 may extend from third portion 380 and/or may be configured to engage a second side 46 of circuit board 40. First tab 390, second tab 392, third tab 394, and/or fourth tab 396 may be configured to deflect, such as during insertion of positioning column 350 into circuit board 40. For example, and without limitation, if positioning column 350 is inserted from first side 44 of circuit board 40, third and fourth tabs 394, 396 may deflect radially inward as they pass through circuit board 40 and may deflect back outward once they reach second side 46. First and second tabs 390, 392 may limit an insertion depth of positioning column 350 through circuit board 40. If positioning column 350 is inserted from second side 46 of circuit board 40, first and second tabs 390, 392 may deflect radially inward as they pass through circuit board 40 and may deflect back outward once they reach first side 46. Third and fourth tabs 394, 396 may limit an insertion depth of positioning column 350 through circuit board 40. Once insertion is complete, first tab 390, second tab 392, third tab 394, and/or fourth tab 396 may restrict movement of positioning column 350 relative to circuit board 40 (e.g., vertical movement). With embodiments, first tab 390 may be axially aligned (e.g., along a direction perpendicular to circuit board 40) with second tab 392 and/or circumferentially aligned with (e.g., may be about the same distance from circuit board 40 as) third tab 394. Fourth tab 396 may be axially aligned with third tab 394 and/or circumferentially aligned with second tab 392. First tab 390 may extend toward third tab 394 and/or third tab 394 may extend toward first tab 390. Second tab 392 may extend toward fourth tab 396 and/or fourth tab 396 may extend toward second tab 392. First resilient member 62 may be configured to receive at least some of first portion 360 and/or may be connected to and/or disposed at least partially around first portion 360, which may include at least some of first tab 390 and/or second tab 392 being disposed within first resilient member 62. Second resilient member 64 may be configured to receive at least some of third portion 380 and/or may be connected to and/or disposed at least partially around third portion 380, which may include at least some of third tab 394 and/or fourth tab 396 being disposed within second resilient member 64. First portion 360 and/or third portion 380 may be referred to as flared or tabbed portions.

As generally illustrated in FIGS. 7A and 7C, in embodiments, first housing member 20 may be configured to receive at least a portion of first resilient member 62 and/or first portion 360 of positioning column 350. For example, and without limitation, in an assembled configuration, at least some of first resilient member 62 and positioning column first portion 360 may be disposed in a mating portion 22 of first housing member 20. Mating portion 22 of first housing member 20 may include a projection 22A that may be configured for insertion into positioning column 350. For example, and without limitation, in an assembled configuration, projection 22A may extend at least about half way between a top 352 of positioning column 350 and circuit board 40. Projection 22A may include, for example, a cylindrical configuration. Second housing member 30 may be configured to receive at least some of second resilient member 64 and/or third portion 380 of positioning column 350. For example, and without limitation, in an assembled configuration, at least some of second resilient member 64 and positioning column third portion 380 may be disposed in a mating portion 32 of second housing member 30. Mating portion 32 of second housing member 30 may include a projection 32A that may be configured similarly to projection 22A of first housing member 20 and may be configured for insertion into positioning column 350.

Figure 8A:
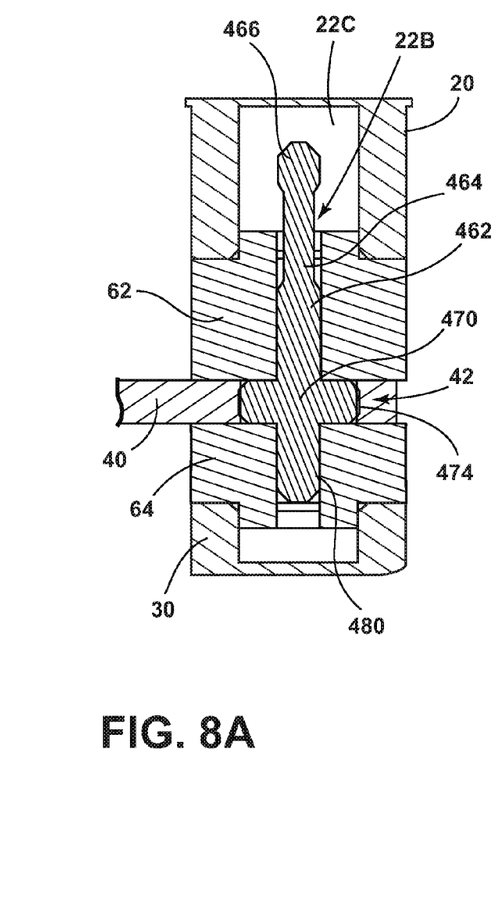
FIG. 8A is a cross-sectional view of an embodiment of a circuit board, a positioning column, a first resilient member, a first housing member, a second resilient member, and a second housing member according to teachings of the present disclosure.
Figure 8B:
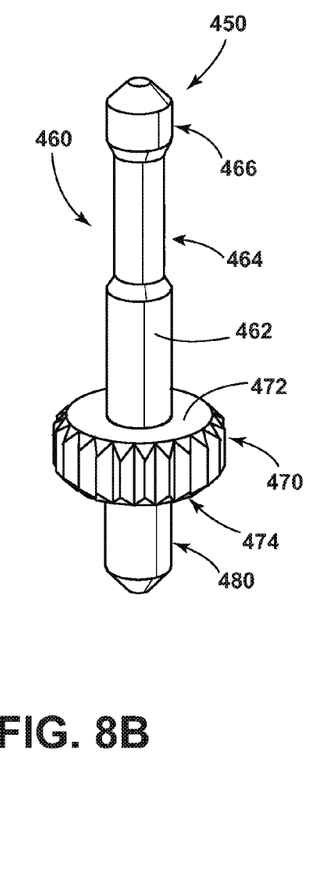
FIG. 8B is a perspective view of an embodiment of a positioning column according to teachings of the present disclosure.
Figure 8C:
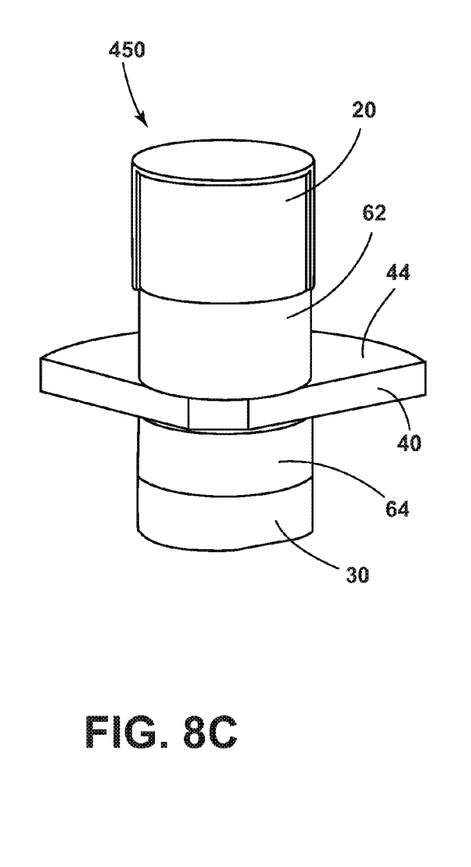
FIG. 8C is a perspective view of an embodiment of a circuit board, a positioning column covered by a first resilient member, a first housing member, a second resilient member, and a second housing member according to teachings of the present disclosure.

In embodiments, such as generally illustrated in FIGS. 8A, 8B, and 8C, a positioning column 450 may include a generally cylindrical configuration and/or may be solid. Positioning column 450 may include a first portion 460, a second portion 470, and/or a third portion 480. First portion 460 may correspond to a top portion of positioning column 450, second portion 470 may correspond to a middle portion of positioning column 450 that may be disposed between first portion 460 and third portion 480, and/or third portion 480 may correspond to a bottom portion of positioning column 450. Positioning column 450 may, for example, include metal and/or metallic materials. First portion 460 may include a base 462, a narrow portion 464, and/or a head 466. Narrow portion 464 may include a smaller diameter than other sections of first portion 460 and/or positioning column 450. Base 462 may be disposed adjacent to second portion 470, narrow portion 464 may extend from base 462, and/or head 466 may extend from narrow portion 464 (e.g., may be disposed at an end of first portion 460). Head 466 may include a greater diameter than narrow portion 464. Second portion 470 of positioning column 450 may include a radially-extending flange 472 that may be configured for insertion into circuit board 40. For example, and without limitation, one or more radially-extending ribs 474 may extend from flange 472 and may be generally aligned with the axial direction (e.g., perpendicular to circuit board 40). Ribs 474 may be configured to engage aperture 42 of circuit board 40. With embodiments, flange 472 may be press fit/interference fit with circuit board 40. Third portion 480 of positioning column 450 may include a generally cylindrical configuration and/or may be referred to as a post.

As generally illustrated in FIGS. 8A and 8C, in embodiments, first housing member 20 may be configured to interface with, mate with, and/or receive at least a portion of first resilient member 62 and/or first portion 460 of positioning column 450. For example, and without limitation, in an assembled configuration, at least some of first resilient member 62 and positioning column first portion 460 may be disposed in a mating portion 22 of first housing member 20 and/or housing member 20 may compress first resilient member 62, at least to some degree. Mating portion 22 of first housing member 20 may include an aperture 22B that may be configured to receive head 466. For example, and without limitation, in an assembled configuration, head 466 may be disposed and/or retained in a chamber 22C of mating portion 22 and/or at least some of narrow portion 464 may be disposed in aperture 22B. Second housing member 30 may be configured to receive at least some of second resilient member 64 and/or third portion 480 of positioning column 450. For example, and without limitation, in an assembled configuration, at least some of second resilient member 64 and/or positioning column third portion 480 may be disposed in a mating portion 32 of second housing member 30. In embodiments, third portion 480 of positioning column 450 may not extend beyond second resilient member 64 and/or may not extend into second housing member 30.

Figure 9A:
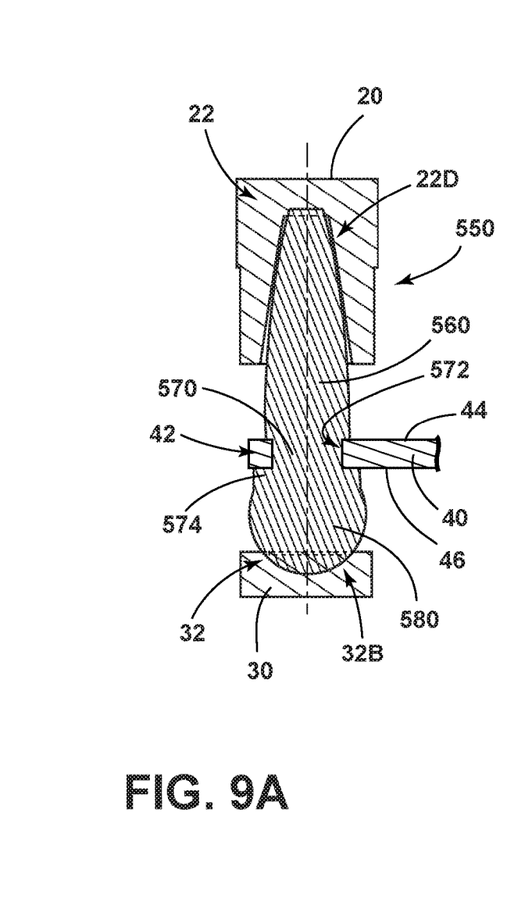
FIG. 9A is a cross-sectional view of an embodiment of a circuit board, a positioning column, a first housing member, and a second housing member according to teachings of the present disclosure.
Figure 9B:
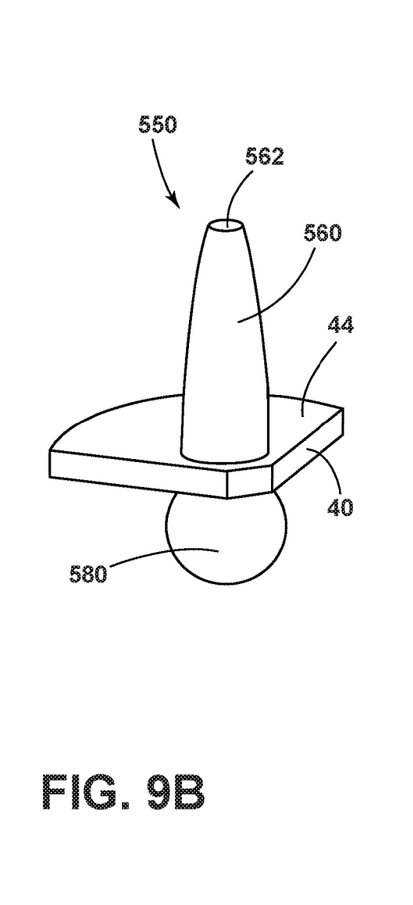
FIG. 9B is a perspective view of an embodiment of a circuit board and a positioning column according to teachings of the present disclosure.
Figure 9C:
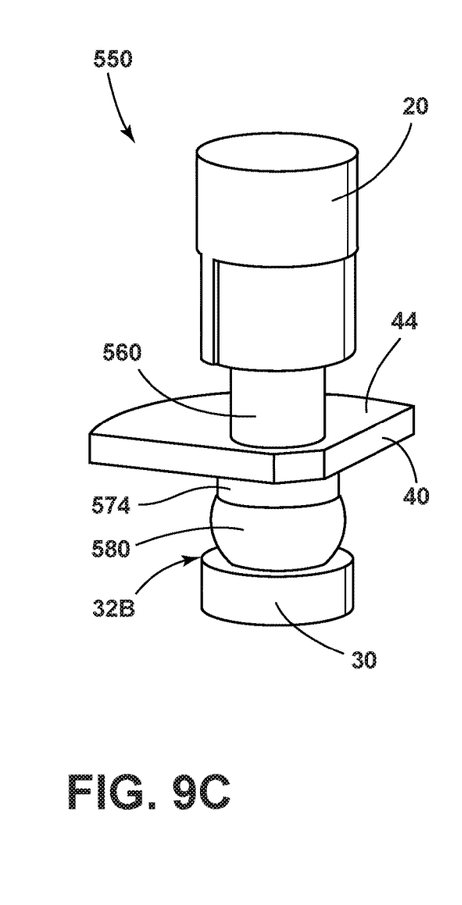
FIG. 9C is a perspective view of an embodiment of a circuit board, a positioning column, a first housing member, and a second housing member according to teachings of the present disclosure.

In embodiments, such as generally illustrated in FIGS. 9A, 9B, and 9C, a positioning column 550 may include a generally cylindrical configuration and/or may be solid. Positioning column 550 may include a first portion 560, a second portion 570, and/or a third portion 580. First portion 560 may correspond to a top portion of positioning column 550, second portion 560 may correspond to a middle portion of positioning column 550 that may be disposed between first portion 560 and third portion 580, and/or third portion 580 may correspond to a bottom portion of positioning column 550. Positioning column 550 may, for example, include rubber and/or one or more other resilient materials. In embodiments, first portion 560 may include a generally tapered and/or conical configuration. For example, and without limitation, a diameter of first portion 560 may be greatest near second portion 570 and may decrease toward an end 562 of first portion 560. End 562 of first portion 560 may, for example, be generally planar and/or may be generally parallel to circuit board 40. Second portion 570 may include a circumferential recess/groove 572 and/or a ring portion 574. Recess 572 may be configured to receive at least a portion of circuit board 40 and/or may be configured to limit relative movement of positioning column 550 and circuit board 40 once positioning column 550 has been inserted into circuit board 40. Ring portion 574 may be disposed adjacent to recess 572 and/or may include a diameter greater than that of recess 572 and/or first portion 560. The diameter of ring portion 572 may be greater than an aperture 42 of circuit board 40 and/or ring portion 572 may be configured to limit an insertion depth of positioning column 550 through circuit board 40. Third portion 580 may be disposed adjacent to ring portion 574 and/or may be generally rounded and/or spherical. First portion 560 and third portion 580 may include one or more of a variety of configurations. For example, and without limitation, both of first portion 560 and third portion 580 may include generally tapered shapes configured to be received by housing members 20, 30, and/or may include generally cylindrical shapes configured to be received by housing member 20, 30 (e.g., in tapered/chamfered recesses/apertures).

As generally illustrated in FIGS. 9A and 9C, in embodiments, first housing member 20 may be configured to receive at least some of first portion 560 of positioning column 550. For example, and without limitation, in an assembled configuration, at least some (e.g., about half) of positioning column first portion 560 may be disposed in a tapered recess 22D of a mating portion 22 of first housing member 20. Second housing member 30 may be configured to receive at least some of third portion 580 of positioning column 550. For example, and without limitation, a mating portion 32 of second housing member 30 may include a recess 32B that may include a generally semi-spherical or spherical cap shape. In an assembled configuration, at least some (e.g., about one quarter) of positioning column third portion 580 may be disposed in recess 32B. Positioning column 550 may be configured for a rings cushioning effect.

With embodiments, a positioning column (e.g., columns 50, 250, 350, 450, 550) may be a single, unitary component and/or may include a single material (e.g., a metal, an alloy, a rubber, a polymer, etc.).

In some figures, portions of certain elements (e.g., first housing member 20, second housing member 30, circuit board 40, etc.) may not be shown and/or may be hidden to more readily illustrate other elements.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

It should be understood that references to a single element are not so limited and may include one or more of such element. All directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure.

Furthermore, the mixing and matching of features, elements and/or functions between various examples is expressly contemplated herein so that one of ordinary skill in the art would appreciate from this disclosure that features, elements, and/or functions of one example may be incorporated into another example as appropriate, unless described otherwise, above. Moreover, many modifications may be made to adapt a particular situation or material to the teachings of the present disclosure without departing from the essential scope thereof. Therefore, it is intended that the present teachings not be limited to the particular examples illustrated by the drawings and described in the specification, but that the scope of the present disclosure will include any embodiments falling within the foregoing description and the appended claims.

What is claimed is:

1. An electrical unit, comprising:
   a first housing member;
   a second housing member;
   a circuit board disposed at least partially between the first housing member and the second housing member;
   a positioning column disposed at least partially in the circuit board;

a first resilient member connected to the positioning column between the circuit board and the first housing member;
a second resilient member connected to the positioning column; and
wherein the first housing member is in contact with the first resilient member and the second housing member is in contact with the second resilient member; the positioning column includes a first portion, a second portion including a radial flange, and a third portion; the third portion includes a flared portion configured for insertion through the circuit board; and at least a portion of the circuit board is disposed between the flared portion and the radial flange.

2. The electrical unit of claim 1, wherein the second resilient member is disposed between the circuit board and the second housing member.

3. The electrical unit of claim 2, wherein the positioning column is integrated with the second housing member.

4. The electrical unit of the claim 1, wherein the first resilient member includes a first height, the second resilient member includes a second height, and the first height is greater than the second height.

5. An electrical unit, comprising:
a first housing member;
a second housing member;
a circuit board disposed at least partially between the first housing member and the second housing member;
a positioning column disposed at least partially in the circuit board;
a first resilient member connected to the positioning column between the circuit board and the first housing member;
a second resilient member connected to the positioning column; and
wherein the first housing member is in contact with the first resilient member and the second housing member is in contact with the second resilient member;
wherein the positioning column includes a first flared portion and a second flared portion.

6. The electrical unit of claim 5, wherein at least a portion of the circuit board is disposed between the first flared portion and the second flared portion.

7. The electrical unit of claim 5, wherein the first flared portion and the second flared portion are configured to be inserted through the circuit board.

8. The electrical unit of claim 7, wherein the first flared portion includes a first tab and a second tab, and the second flared portion includes a third tab and a fourth tab.

9. The electrical unit of claim 8, wherein the positioning column is metal.

10. The electrical unit of claim 9, wherein the positioning column is hollow.

11. The electrical unit of claim 8, wherein the first housing member includes a projection disposed in the positioning column.

12. An electrical unit comprising:
a first housing member;
a second housing member;
a circuit board disposed at least partially between the first housing member and the second housing member;
a positioning column disposed at least partially in the circuit board;
a first resilient member connected to the positioning column between the circuit board and the first housing member; and
a radial flange;
wherein the radial flange includes a plurality of ribs configured to engage the circuit board.

13. The electrical unit of claim 12, wherein the positioning column is disposed at least partially in the first housing member.

14. The electrical unit of claim 12, wherein the positioning column includes a first portion, a second portion including the radial flange, and a third portion.

15. The electrical unit of claim 14, wherein the first portion includes a narrow portion and a head disposed at an end of the narrow portion, the head including a greater diameter than the narrow portion, wherein the first housing member is configured to receive and retain the head.

16. The electrical unit of claim 12, wherein the positioning column is interference fit with the circuit board.

17. The electrical unit of claim 12, wherein the positioning column limits forces applied to the circuit board from the first housing member and the second housing member.

18. An electrical unit, comprising:
a first housing member;
a second housing member;
a circuit board disposed at least partially between the first housing member and the second housing member; and
a positioning column comprising a resilient material and a tapered portion, the positioning column disposed at least partially in the first housing member and at least partially in the second housing member;
wherein the first housing member includes a tapered recess configured to receive the tapered portion of the positioning column.

19. The electrical unit of claim 18, wherein the positioning column includes:
the tapered portion disposed above a first side of the circuit board;
a second portion disposed at least partially in the circuit board; and
a substantially spherical third portion disposed below a second side of the circuit board;
wherein the second portion includes a recess configured to receive at least a portion of the circuit board; and, the second housing member includes a spherical cap-shaped recess configured to receive at least a portion of the substantially spherical third portion.

* * * * *